(12) United States Patent
Sforzin et al.

(10) Patent No.: US 12,001,706 B2
(45) Date of Patent: Jun. 4, 2024

(54) PREDICTIVE SANITIZATION OF AN ARRAY OF MEMORY WITH CAPACITIVE CELLS AND/OR FERROELECTRIC CELLS

(71) Applicant: Micron Technology, Inc., Boise, ID (US)

(72) Inventors: Marco Sforzin, Milan (IT); Angelo Visconti, Appiano Gentile (IT); Giorgio Servalli, Fara Gera d'Adda (IT); Daniele Balluchi, Milan (IT); Paolo Amato, Treviglio (IT)

(73) Assignee: Micron Technology, Inc., Boise, ID (US)

( * ) Notice: Subject to any disclaimer, the term of this patent is extended or adjusted under 35 U.S.C. 154(b) by 64 days.

(21) Appl. No.: 17/854,639

(22) Filed: Jun. 30, 2022

(65) Prior Publication Data

US 2023/0236753 A1 Jul. 27, 2023

Related U.S. Application Data

(60) Provisional application No. 63/301,985, filed on Jan. 21, 2022.

(51) Int. Cl.
*G06F 3/06* (2006.01)

(52) U.S. Cl.
CPC .......... *G06F 3/0652* (2013.01); *G06F 3/0616* (2013.01); *G06F 3/0673* (2013.01)

(58) Field of Classification Search
CPC .... G06F 3/0652; G06F 3/0616; G06F 3/0673; G11C 29/52; G11C 2029/0409
See application file for complete search history.

(56) References Cited

U.S. PATENT DOCUMENTS

| | | | | |
|---|---|---|---|---|
| 2010/0023800 | A1* | 1/2010 | Harari | G11C 16/0483 711/E12.008 |
| 2011/0161784 | A1* | 6/2011 | Selinger | G06F 11/1016 714/E11.002 |
| 2017/0315879 | A1* | 11/2017 | Park | G11C 29/52 |
| 2020/0387323 | A1* | 12/2020 | Boehm | G06F 11/1076 |

FOREIGN PATENT DOCUMENTS

DE 102021122170 A1 * 3/2022

* cited by examiner

*Primary Examiner* — Zhuo H Li
(74) *Attorney, Agent, or Firm* — Wood IP LLC; Theodore A. Wood

(57) ABSTRACT

Provided is a computing system including a memory system in communication with a host, to store data therein. The memory system includes a memory having a plurality of memory components coupled to the controller via a memory interface; and a memory controller configured to communicate with the memory to control data transmission and performing scrubbing operation of the memory components and detecting a region of the memory to be sanitized and performing a sanitization operation of the detected region to prevent the occurrence of failure.

19 Claims, 7 Drawing Sheets

PREDICTIVE SANITIZATION OF AN ARRAY OF MEMORY WITH CAPACITIVE CELLS AND/OR FERROELECTRIC CELLS

CROSS REFERENCE TO RELATED APPLICATIONS

This application claims benefit to U.S. Provisional Patent Application No. 63/301,985 filed 21 Jan. 2022 and entitled "Predictive Sanitization of An Array of Memory with Capacitive Cells and/or Ferroelectric Cells," the disclosure of which is incorporated herein in its entirety by reference.

TECHNICAL FIELD

The present disclosure relates generally to memory system and methods, and more particularly to a predictive sanitization method for preventing the occurrence of a failure in memory to enhance media reliability.

BACKGROUND

Memory devices (also referred to as "memory media devices") are widely used to store information in various electronic devices such as computers, user devices, wireless communication devices, cameras, digital displays, and the like. Information is stored by programing memory cells within a memory device to various states.

In conventional memories using traditional scrubbing techniques, patrol scrubbing is performed where each data entry in a memory is read periodically and if it has a correctable error, it is corrected and written back to the memory to avoid accumulation of errors.

Instead of detecting and correcting errors using traditional scrubbing, it is desirable to predict the possibility of failure and prevent the occurrence of an error in advance, to thereby prolong the life of components of memory with capacitive cells and/or ferroelectric cells in compute express link (CXL) devices and increase the memory reliability.

Figure 1:
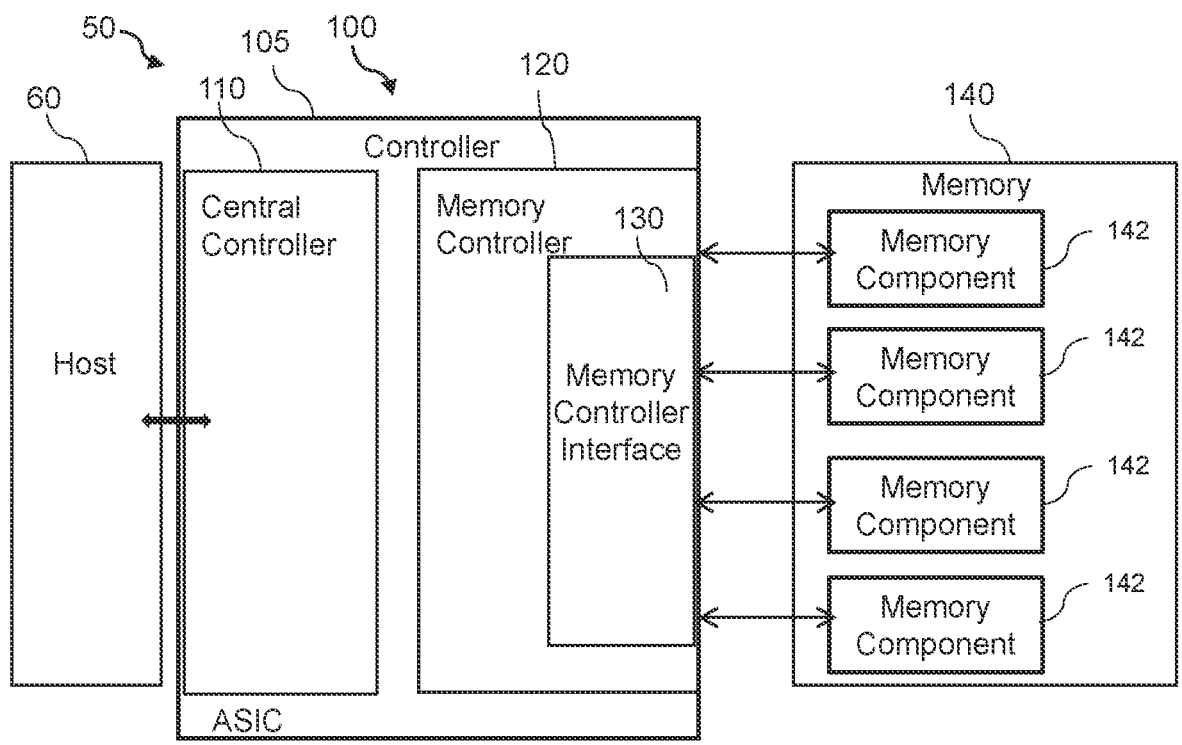
FIG. 1 is a block diagram illustrating a memory system of a computing system according to one or more exemplary embodiments of the present invention.

The drawings are only for purposes of illustrating preferred embodiments and are not to be construed as limiting the disclosure. Given the following enabling description of the drawings, the novel aspects of the presently described technology should become evident to a person of ordinary skill in the art. This detailed description uses numerical and letter designations to refer to features in the drawings. Like or similar designations in the drawings and description have been used to refer to like or similar parts of embodiments of the presently described technology.

DETAILED DESCRIPTION OF THE EMBODIMENTS

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In a CXL memory device based on technology related to memory with capacitive cells and/or ferroelectric cells, by using the patrol scrubbing, there is a search for array regions (i.e., memory with capacitive cells and/or ferroelectric cells) that are about to cross a minimum window budget limit to predict and prevent the occurrence of error, to thereby allow a reliable reading. Once the region to sanitize is detected, the remedy to re-enlarge the window is performed on the region. A register in the controller will replace the region under sanitization during the remedy time.

This approach provides a high strategic value as it provides possible improvement in reliability, availability, and serviceability (RAS) features of CXL devices based on technologies related to memory with capacitive cells and/or ferroelectric cells. Instead of repairing an occurred failure, this approach aims to prevent the occurrence of a failure.

FIG. 1 is a block diagram illustrating a memory system 100 of a computing system 50 according to one or more exemplary embodiments of the present invention. The memory system 100 is an ASIC-type and includes a controller 105 including a central controller or processor 110, a memory controller 120, and a memory 140 and a memory controller interface 130 for communicating with the memory 140.

The memory 140 includes a plurality of memory components 142. The memory system 100 is in communication with a host 60. The host 60 can be a host system including for example, a personal laptop computer, a desktop computer, a mobile device (e.g., a cellular phone), a network servicer, a memory card reader, a camera or any other suitable type of host system or device.

According to one or more embodiments, the central controller or processor 110 executes instructions stored within the memory 140 to performs tasks and to control the overall operation of the computing system 50.

The memory controller 120 performs scrubbing operations (e.g., patrol scrubbing) of the memory 140 to prevent the occurrence of failure and the patrol scrubbing is managed by the central controller 110. The memory controller 120 may include a patrol scrubber for performing the patrol scrubbing operations. The memory controller 120 also performs read and write operations of data to memory components 142 of the memory 140 in response to request received from the controller 110 and or I/O devices (not shown).

According to one or more embodiments, the memory 140 is a compute express link (CXL) memory and the memory components 142 include capacitive cells and/or ferroelectric cells. The memory controller 120 is configured to issue a patrol scrubbing request to scrub the memory 140. Details of the predictive sanitization process according to one or more embodiments of the present invention will be discussed below with reference to FIGS. 2 through 7.

The predictive sanitization method described in the present disclosure is defined in three steps—detection of a region to sanitize; replacement of the detected region with a register in the memory controller 120; sanitization of the detected region; and the re-enablement of the region.

During detection, the memory controller 120 performs a special read using a special reference voltage (VREF+) (also referred to as "Vsaref") different from the reference voltage (VREF) used during a routine read operation to be performed by the memory controller 120. The special reference voltage (VREF+) level has less margin to fail compared to the reference voltage (VREF).

Specifically, in this embodiment, when a scrubbing operation is performed on a specific area of a specific memory component 142, the scrubbing operation is interpreted by the memory component 142 as a read operation performed with a special VREF. The memory controller 120 can select the special VREF between a set of VREF values.

This selection can be coded by a proper number of bits in a scrubbing command of the memory controller 120. The reference voltage (VREF) used during a routine read operation typically ranges between 1 and 3 volts (V). The special reference voltage (VREF+) is obtained by reducing the reference voltage VREF by a small delta (Δ) value, for example, by a few hundreds of millivolts (mV). For example, if the reference voltage VREF is approximately 3 volts (V), then the special reference voltage (VREF+) may be approximately the VREF−300 mV. The present disclosure is not limited hereto and may vary accordingly.

Figure 2:
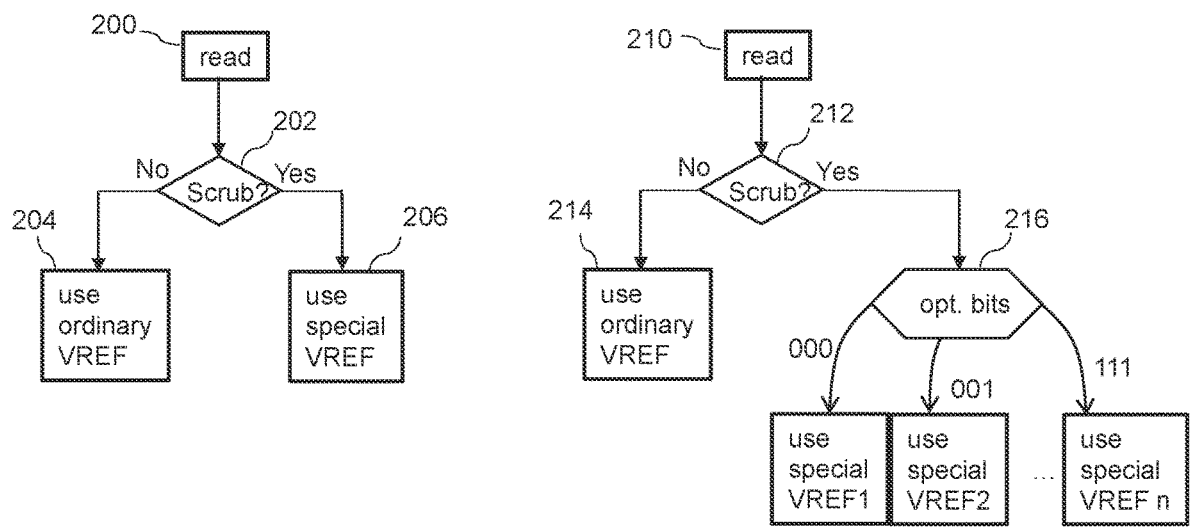
FIG. 2 is a flow diagram illustrating exemplary special read processes to be performed during for the detection operation of the predictive sanitization method performed within the memory.

FIG. 2 is a flow diagram illustrating example special read processes to be performed during the detection operation of the predictive sanitization method. For making the detection, the memory controller 120 performs a special reading forcing a window reduction, or in any case by reducing the margin pf of the sense amplifier from for example, VREF to VREF−300 mv as mentioned in the above example. The read processes may be formed as a single or multiple option as shown in FIG. 2. At operation 200 in the single option, a read process is initiated and it is determined whether to scrub the data at operation 202. If not, then the read operation is performed using an ordinary VREF at operation 204. If it is determined that scrubbing should be performed at operation 202, then the process continues to operation 206 where the scrubbing operation is performed using a special VREF.

In alternative embodiment, e.g., a multiple option, at operation 210 a read process is initiated, and it is determined whether to scrub the data at operation 212. If not, then the read is performed using an ordinary VREF at operation 214. If it is determined that scrubbing should be performed at operation 212, then the process continues to operation 216 where scrubbing of several bits (000, 001, 111) are performed using different special VREFs (VREF1, VREF2 . . . VREFn).

During the detection process, a list of locations, pages, blocks, die, or other component, to be sanitized is collected by the memory controller 120. The memory controller 120 or the memory component 142 of the memory 140 determines where to start the sanitization process for example, which bank, of which device, of which rank. This determination is made using various criteria. For example, in one embodiment, sanitization starts at the portion of the media subsystem (e.g., bank or die) which is closer to drifting into an error state. Alternatively, according to another embodiment, the sanitization process may start at portions of the media subsystem that are not accessible due to being uploaded on cache, or the most recent least accessed portions of the media subsystem.

Figure 3:
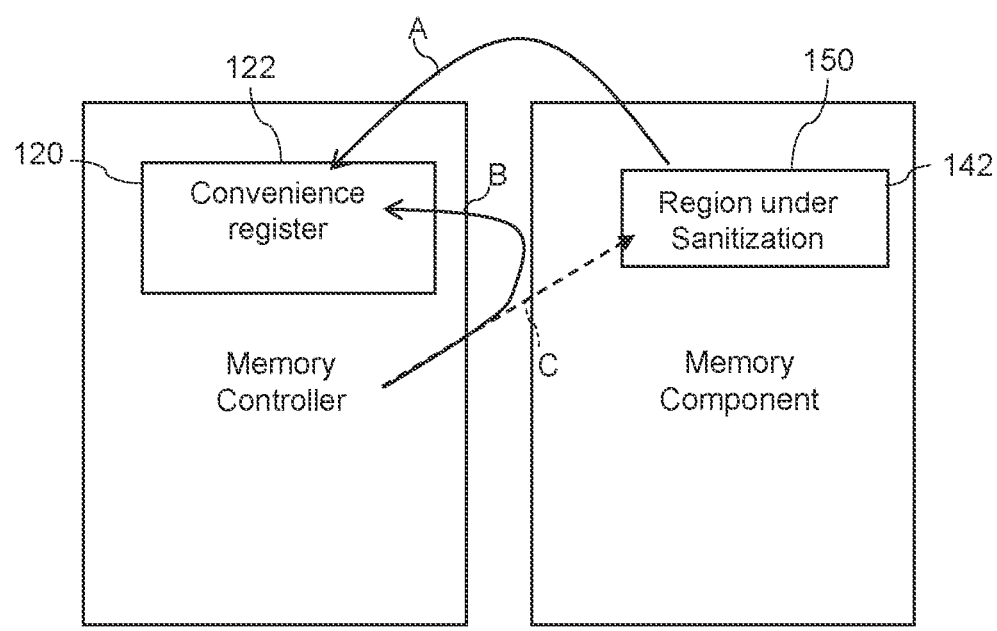
FIG. 3 is a block diagram illustrating the replacement of a detected region to be scrubbed, according to one or more exemplary embodiments of the present disclosure.
Figure 4:
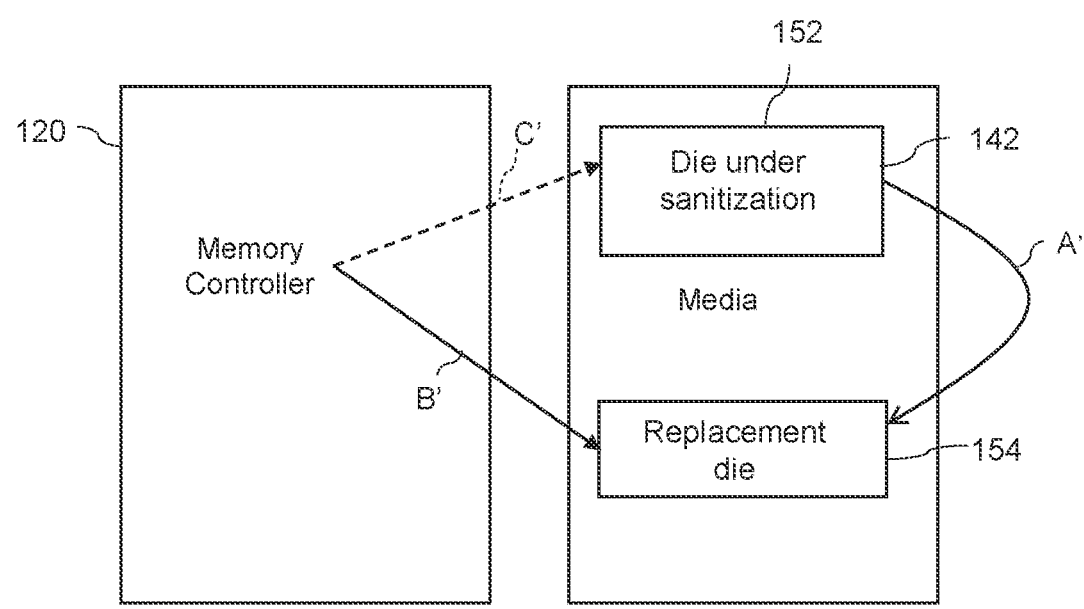
FIG. 4 is a block diagram illustrating the replacement of a detected region to be scrubbed, according to alternative exemplary embodiments of the present disclosure.

FIGS. 3 and 4 are block diagrams illustrating the replacement of a detected region to be sanitized or scrubbed according to one or more exemplary embodiments of the present disclosure. During the replacement of a detected region, the data in the detected region is copied to another location to be accessed when needed.

As shown in FIG. 3, once the detection is performed and a region to be sanitized is detected, the memory controller 120 performs a replacement of the detected region 150 under sanitization with a convenience register 122 within the application-specific integrated circuit (ASIC) environment or a set of convenience registers when performing sanitization of multiple areas at the same time, in the memory controller 120 as shown in FIG. 3.

The data from the detected region 150 within the memory component 142 is copied to the convenience register 122 of the memory controller 120 (as indicated by arrow A) and after the copying operation is completed, the memory controller 120 will access the convenience register 122 for data (as depicted by arrow B) when desired instead of the detected region 150 to be sanitized (as indicated by arrow C).

Therefore, the host 60 (as shown in FIG. 1) will address the convenience register 122 in the memory controller 120 instead of the memory component 142 of the memory 140. That is, valid data of the detected region 150 will be copied in the convenience register 122, and then the convenience register 122 is enabled to temporarily replace the detected region 150.

As shown in FIG. 4, instead of copying the data from a die 152 for example, of a detected region to be sanitized to one or more convenience registers 122 inside the memory controller 120, the memory component 142 includes a replacement die 154. The replacement die 154 serves as a region where the memory controller 120 initiates the copy operation. The memory component 142 performs the copying operation and copies the data from the die 152 to the replacement die 154 (as indicated by arrow A').

After the copy operation is complete, then the memory controller 120 will access the replacement die 154 for data (as indicated by arrow B') instead of accessing the die 152 under sanitization (as indicated by arrow C').

According to the embodiments, the replacement area can be a die, one or more memory components 142, one or more banks per die, one or more blocks of rows per bank, a single row per bank, a single page per bank or one or more convenience registers. The convenience registers can be one per die, one per bank or one per blocks of rows.

The memory controller 120 can also reserve the same area in the memory address space of a memory component 142 to use as a convenience area where to copy valid data of the detected region to be sanitized.

Figure 5:
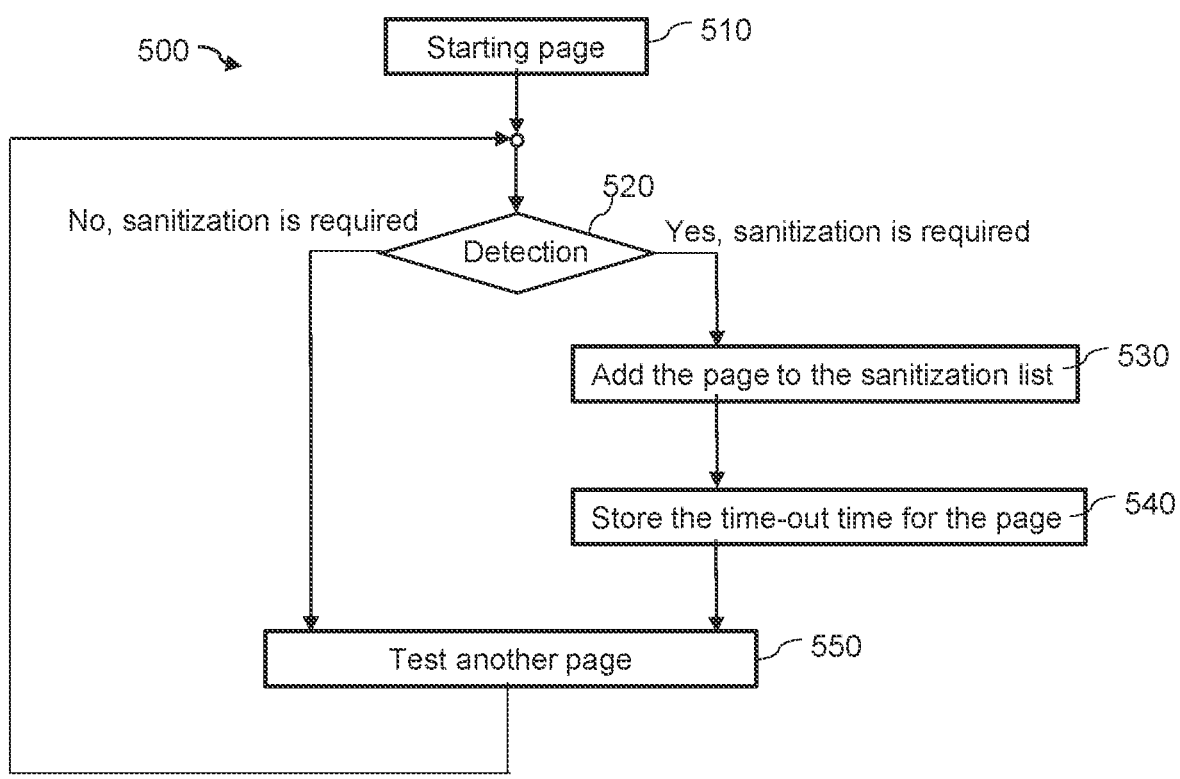
FIG. 5 is a flow diagram illustrating a predictive sanitization operation being performed, according to one or more exemplary embodiments of the present disclosure.
Figure 6:
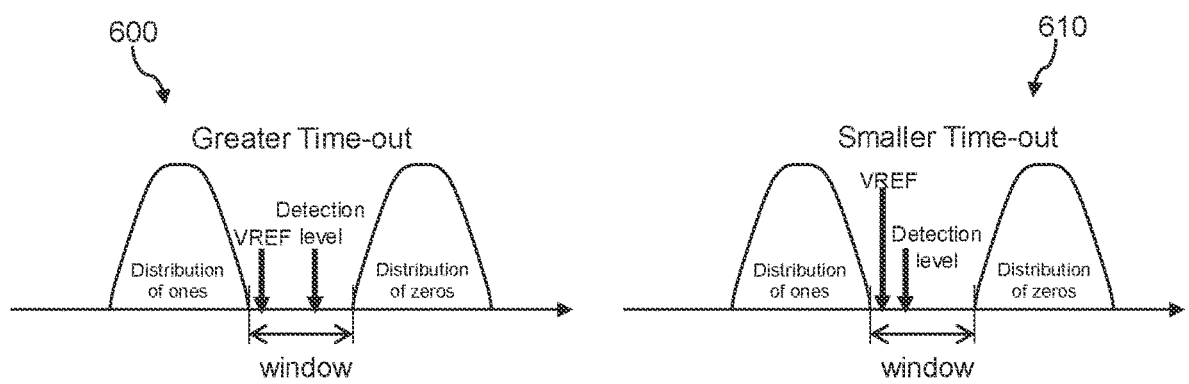
FIG. 6 illustrates a diagram showing example time-out periods of the predictive sanitization operation of FIG. 5, according to one or more exemplary embodiments of the present disclosure.

Once the data has been copied to the replacement area, sanitization of the detected region 150 (e.g., the die 152) is performed. FIG. 5 illustrates a flow diagram illustrating a predictive sanitization operation being performed. FIG. 6 is a diagram showing time-out periods during the predictive sanitization operation of FIG. 5.

The memory controller 120 sends a command to the memory component 142 to perform the predictive sanitization operation including providing a certain number of fast cycles for cycling the detected region. This operation does not include occupying the I/O bandwidth (BW) to cycle the region. However, the predictive sanitization process may interfere with the host traffic of the host 60 (depicted in FIG. 1) thereby reducing the core BW.

To avoid such interference or high collision, the memory controller 120 is configured to properly schedule and postpone, if necessary, the sanitization of the detected region(s) to minimize the impact on performance. For example, if the host 60 is currently accessing the data at the detected region(s), the memory controller 120 will postpone the sanitization of that detected region(s) for a later time.

As shown FIG. 5, assuming the detected region to be sanitized is a "page" for purposes of illustration only, the method 500 begins at operation 510. At operation 510 a starting page is selected. At operation 520, detection is performed to determine whether the page needs to be sanitized. If at operation 520, it is determined that the page needs to be sanitized, the memory controller 120 adds the page to a sanitization list and at operation 540. The memory controller 120 stores a time-out period (as depicted in FIG. 6) for sanitization of the page.

At operation 550, another page is tested for sanitization. If it is determined at operation 520, that sanitization is not required, then the method 500 continues directly to operation 540 where another page is tested to determine whether sanitization is needed.

As shown in FIG. 6, the length of time of the time-out period for sanitization of each page depends on the special VREF used for the detection (as depicted in FIG. 2). The greater time-out (i.e., the delta margin) 600, the longer the time available for sanitization before the memory cell will fail. The smaller, shorter time-out (i.e., the delta margin) 610 which allocates for shorter time between sanitization trigger and its occurrence has the advantage of being more effective resulting in less system overhead.

After sanitization is performed, re-enablement of the now sanitized region 150 of the memory component 142 of the memory 140 is performed. During the re-enablement process, the memory controller 120 re-addresses the data back to the newly sanitized region 150, thereby freeing up the convenience register 122 (as shown in FIG. 3) or replacement region (e.g., replacement die 154 as shown in FIG. 4) for next sanitization processes.

Figure 7:
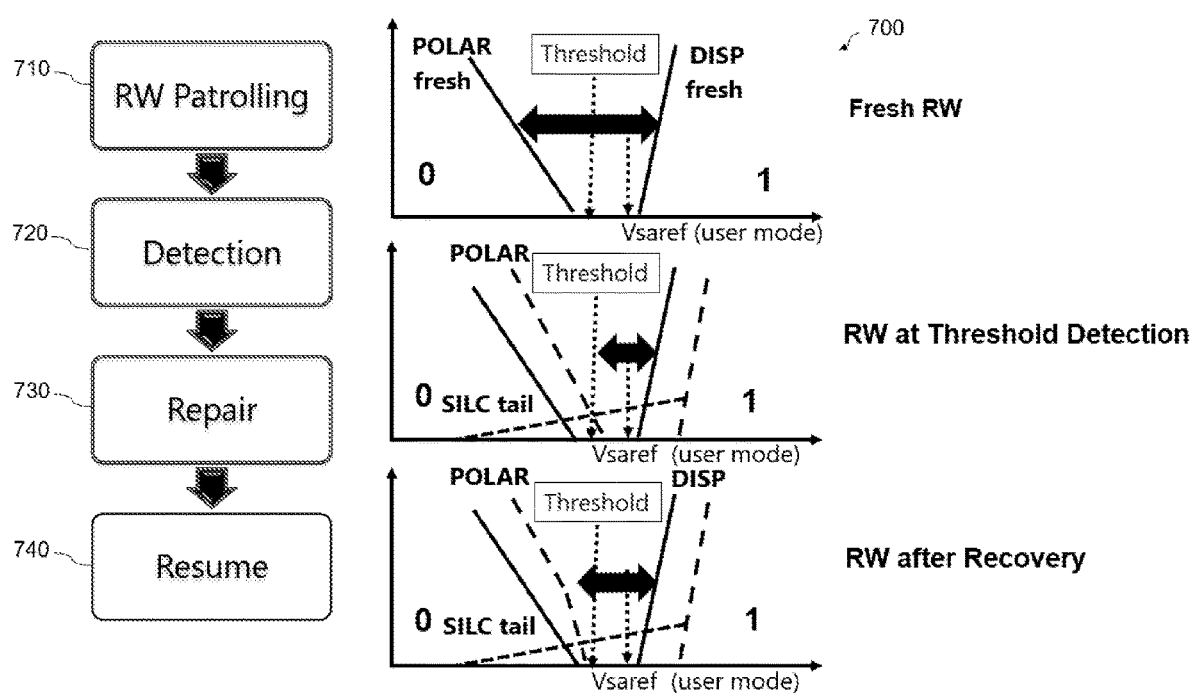
FIG. 7 illustrates a flow process for performing the overall predictive sanitization method according to one or more embodiments of the present disclosure.

FIG. 7 illustrates a flow process for performing the overall predictive sanitization method 700 according to the embodiments. As shown in FIG. 7, the method 700 begins at operation 710. At operation 710, the scrub is performed by scanning all the locations of the memory components 142 of the memory 140. This can be achieved, for example, by using a brute-force scanning method or other suitable scanning method.

The operation 710 determines any regions that are about to cross a minimum window budget limit having a threshold reference between the two reference states zero (1) and one (1) at a given voltage level (i.e., the special reference voltage Vsaref). The purpose is to observe any error for correction of the error and to write back the data to prevent the accumulation of errors.

At operation 720, the memory controller 120 reduces the window of margin and detects whether a given page, for example, will have an error(s) in the near future in time. At operation 730, the window of the detected region is re-enlarged and a repair or recovery of the detected region is conducted. At this time, the data from the page is temporarily moved to another location, and the page is repaired.

At operation 740, the data is moved back to the detected region and data operations are resumed.

In the method shown in FIG. 7, according to this embodiment, the user mode is the routine or ordinary read operation. Wear out failure mechanism are causing the RW to close as a function of the manner in which a cell is assessed, i.e., the number of accesses, time between two consecutive access, cell level between two consecutive access.

By performing predictive sanitization of memory, a number of embodiments of the present disclosure provide benefits such as improving the lifetime and reliability of the memory by preventing the occurrence of a failure instead of repairing an occurred failure within CXL devices during read and write operations. Additional advantages of embodiments of the present disclosure include increased system reliability, availability, serviceability (RAS) i.e., annualized failure rate (AFR) and silent data corruption (SDC) and increased mitigation towards Hammering attacks.

Although specific embodiments have been illustrated and described herein, those of ordinary skill in the art will appreciate that an arrangement calculated to achieve the same results can be substituted for the specific embodiments shown. This disclosure is intended to cover adaptions or variations of a number of embodiments of the present disclosure. It is to be understood that the above description has been made in an illustrative fashion, and not a restrictive one.

Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A computing system comprising:
   a memory system in communication with a host, and configured to store data therein, the memory system comprising:
   a memory including a plurality of memory components coupled to a memory controller via a memory interface; and
   the memory controller configured to communicate with the memory to control data transmission and configured to: (i) perform a scrubbing operation of the memory components, and (ii) detect a region of the memory to be sanitized and perform a sanitization operation of the detected region to prevent the occurrence of failure;
   wherein the memory controller is further configured to, when detecting the region of the memory to be sanitized:
   (a) determine any regions that are about to cross a minimum window limit having a threshold reference, to observe any error for correction and write back data to prevent an accumulation of errors; and (b) reduce a margin of the minimum window limit and predict whether the detected region will have at least one error in the future.

2. The computing system of claim 1, wherein during detection, the memory controller is further configured to perform a special read operation using a special reference voltage (VREF) different from a reference voltage (VREF) used during a routine read operation to be performed by the memory controller.

3. The computing system of claim 2, wherein when the scrubbing operation is performed on a specific area of a memory component of the plurality of memory components, the scrubbing operation is interpreted by the memory component as a read operation performed with the special VREF.

4. The computing system of claim 3, wherein the memory controller is further configured to select the special VREF between a set of VREF values.

5. The computing system of claim 3, wherein after detecting the region to be sanitized, the memory controller is further configured to replace a detected region to be sanitized by temporarily copying data from the detected region to a replacement location.

6. The computing system of claim 5, wherein the replacement location is one or more convenience registers of the memory controller.

7. The computing system of claim 3, wherein after detecting the region to be sanitized within a memory component of the plurality of memory components, the memory component is configured to replace the detected region to be sanitized by temporarily copying data from the detected region to a replacement location within the memory component.

8. The computing system of claim 7, wherein when the detected region is a die, the replacement location is a replacement die of the memory controller.

9. The computing system of claim 3, wherein the sanitization operation of the detected region is performed by fast cycling of the detected region.

10. The computing system of claim 9, wherein the memory controller is further configured to schedule or postpone the sanitization operation based on current data traffic by assigning a time-out period to the detected region to be sanitized.

11. The computing system of claim 10, wherein a length of time of the time-out period depends on the special VREF used for the detection.

12. The computing system of claim 11, wherein once the sanitization operation is complete, the memory controller is configured to re-address the data back to the sanitized, detected region.

13. A predictive sanitization method performed via a memory system, the method comprising:
performing a scrubbing operation of memory components of a memory in the memory system;
detecting a region of the memory to be sanitized; and
performing a sanitization operation of the detected region to prevent the occurrence of failure;
wherein detecting the region of the memory to be sanitized comprises:
determining any regions that are about to cross a minimum window limit having a threshold reference, to observe any error for correction and write back data to prevent an accumulation of errors; and
reducing a margin of the minimum window limit and predicting whether the detected region will have at least one error in the future.

14. The method of claim 13, wherein performing the sanitization operation comprises:
re-enlarging the minimum window limit of the detected region and performing sanitization operation of the detected region while temporarily moving data therein to a replacement location.

15. The method of claim 14, further comprising performing re-enablement of the detected region by re-addressing data back to the sanitized, detected region upon completing of the sanitization operation.

16. A memory system comprising:
a memory including a plurality of memory components coupled to a memory controller via a memory interface;
wherein the memory controller is configured to communicate with the memory to control data transmission and configured to: (i) perform a scrubbing operation of the memory components, and (ii) detect a region of the memory to be sanitized and perform a sanitization operation of the detected region to prevent the occurrence of failure;
wherein the memory controller is further configured to, when detecting the region of the memory to be sanitized:
(a) determine any regions that are about to cross a minimum window limit having a threshold reference, to observe any error for correction and write back data to prevent an accumulation of errors; and
(b) reduce a margin of the minimum window limit and predict whether the detected region will have at least one error in the future.

17. The memory system of claim 16, wherein after detecting the region to be sanitized, the memory controller is configured to replace a detected region to be sanitized by temporarily copying data from the detected region to a replacement location.

18. The memory system of claim 16, wherein the memory controller is configured to schedule or postpone the sanitization operation based on current data traffic by assigning a time-out period to the detected region to be sanitized.

19. The memory system of claim 18, wherein once the sanitization operation is complete, the memory controller is configured to re-address the data back to the sanitized, detected region.

* * * * *